United States Patent

Kaiho

(10) Patent No.: US 9,118,013 B2
(45) Date of Patent: Aug. 25, 2015

(54) METHOD FOR PRODUCING ORGANIC EL ELEMENT

(75) Inventor: Akio Kaiho, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/504,169

(22) PCT Filed: Oct. 22, 2010

(86) PCT No.: PCT/JP2010/068700
§ 371 (c)(1),
(2), (4) Date: Jul. 11, 2012

(87) PCT Pub. No.: WO2011/052503
PCT Pub. Date: May 5, 2011

(65) Prior Publication Data
US 2012/0268006 A1 Oct. 25, 2012

(30) Foreign Application Priority Data

Oct. 28, 2009 (JP) .............................. P2009-247491

(51) Int. Cl.
*B05C 5/00* (2006.01)
*H05B 33/10* (2006.01)
(Continued)

(52) U.S. Cl.
CPC ............. *H01L 51/0005* (2013.01); *H01L 51/56* (2013.01)

(58) Field of Classification Search
CPC .... H01L 21/6715; H01L 51/56; B05C 5/0254
USPC ................. 445/11, 14; 427/66; 118/300, 313; 347/40, 47, 55–56; 313/504
See application file for complete search history.

(56) References Cited

U.S. PATENT DOCUMENTS 6,040,016 A * 3/2000 Mitani et al. ..................... 427/72
6,344,088 B1 2/2002 Kamikihara et al.
(Continued)

FOREIGN PATENT DOCUMENTS

CN 1684834 A 10/2005
CN 1736130 A 2/2006
(Continued)

OTHER PUBLICATIONS

Extended European Search Report issued Nov. 19, 2013 in counterpart European Patent Application No. 10826635.4.
(Continued)

*Primary Examiner* — Karabi Guharay
(74) *Attorney, Agent, or Firm* — Sughrue Mion, PLLC

(57) ABSTRACT

In a step of forming one or a plurality of organic layers, an object to be coated to become an organic EL element is arranged such that a surface to form the organic layer faces down, while a nozzle having a plurality of slit-shaped outlets for discharging thereabove a coating liquid containing a material to become the organic layer and downwardly depressed cutouts respectively formed at both end parts of each of the slit-shaped outlets is arranged under the object. A coating step of moving the nozzle and the object relative to each other in a predetermined coating direction while keeping the coating liquid discharged from the nozzle in contact with the object and a non-coating step of moving the nozzle and the object relative to each other in the coating direction while keeping the coating liquid away from the object are alternately repeated.

5 Claims, 9 Drawing Sheets

(51) Int. Cl.
  *H01L 51/00* (2006.01)
  *H01L 51/56* (2006.01)

(56) References Cited

U.S. PATENT DOCUMENTS

| | | |
|---|---|---|
| 2005/0101064 A1 | 5/2005 | Yamazaki et al. |
| 2005/0191420 A1 | 9/2005 | Miyakawa et al. |
| 2006/0017782 A1 | 1/2006 | Nishi et al. |
| 2007/0125886 A1 | 6/2007 | Zillig et al. |
| 2007/0272146 A1* | 11/2007 | Cho .................. 118/73 |
| 2012/0024383 A1 | 2/2012 | Kaiho et al. |

FOREIGN PATENT DOCUMENTS

| | | |
|---|---|---|
| JP | 2000-233151 A | 8/2000 |
| JP | 2001-113214 A | 4/2001 |
| JP | 2002-153791 A | 5/2002 |
| JP | 2004-130280 A | 4/2004 |
| JP | 2004-314524 A | 11/2004 |
| JP | 4304954 B2 | 7/2009 |
| WO | 2004/045252 A1 | 5/2004 |
| WO | 2008/088446 A2 | 7/2008 |
| WO | 2010/110481 A1 | 9/2010 |

OTHER PUBLICATIONS

Translation of International Preliminary Report on Patentability for Application No. PCT/JP2010/068700, PCT/IB/338 and PCT/IB/373.
Notice of Reasons for Rejection issued Dec. 20, 2011 in counterpart Japanese Patent Application No. P2009-247491.
First Office Action issued May 29, 2014 in counterpart Japanese Patent Application No. 201080048864.0 with English translation.

* cited by examiner

METHOD FOR PRODUCING ORGANIC EL ELEMENT

CROSS REFERENCE TO RELATED APPLICATIONS

This application is a National Stage of International Application No. PCT/JP2010/068700 filed Oct. 22, 2010, claiming priority based on Japanese Patent Application No. 2009-247491 filed Oct. 28, 2009, the contents of all of which are incorporated herein by reference in their entirety.

TECHNICAL FIELD

The present invention relates to a method for producing an organic EL element, an illumination device, and a planar light source.

BACKGROUND ART

An organic EL element, which is a kind of light-emitting elements, comprises a pair of electrodes and at least one organic layer arranged between the electrodes. Provided as the at least one organic layer is at least one light-emitting layer which emits light. Here, "EL" stands for "Electro Luminescence."

The organic EL element is formed by stacking layers such as electrodes and organic layers in a predetermined order. As a method for forming the organic layers, application processes whose steps are simple have been under study for use. A method for forming an organic layer using an application process initially applies a coating liquid containing a material to become the organic layer to a surface to form the organic layer thereon so as to form a film and then solidifies the coating liquid. This forms the organic layer.

The coating liquid can be applied by a nozzle equipped with a slit-shaped outlet for discharging a coating liquid, for example. Specifically, while the coating liquid discharged from the nozzle is in contact with the surface to form the layer, the nozzle or an object to be coated is swept relative to the other, whereby a band-shaped coating film can be formed. While one streak of band-shaped coating film is formed on the surface when the nozzle is provided with only one slit-shaped outlet, a plurality of band-shaped coating films can be formed by a nozzle provided with a plurality of slit-shaped outlets, for example. For instance, a plurality of band-shaped coating films can be formed by a nozzle in which one slit-shaped outlet is provided with one or a plurality of partitions in order to divide the outlet into a plurality of slit-shaped outlets (see, for example, Patent Literature 1).

CITATION LIST

Patent Literature

Patent Literature 1: Japanese Patent Application Laid-Open No. 2000-233151

SUMMARY OF INVENTION

Technical Problem

Stripe-shaped coating films can surely be formed by a nozzle equipped with a plurality of slit-shaped outlets. Using a conventional nozzle provided with one or a plurality of partitions, however, tends to form the coating film wider than the longitudinal width of the slit-shaped outlet. This is problematic in that the coating film with an intended width is hard to form and may require an additional step of removing the coating film from a part unnecessarily coated therewith according to circumstances.

There is a limit to the size of organic EL elements, since their in-plane luminance distribution becomes more evident as they are made larger. Therefore, the organic EL elements are formed at predetermined intervals not only in the longitudinal direction of the slit-shaped outlet but also in the lateral direction (coating direction) thereof. Forming stripe-shaped coating films by the conventional nozzle is problematic in that parts between the organic EL elements adjacent to each other in the coating direction are unnecessarily coated with the coating liquid, thus necessitating a step of removing the coating film from the parts unnecessarily coated therewith, which increases the number of steps.

It is therefore an object of the present invention to provide a method for producing an organic EL element which can apply a pattern of a coating liquid to become an organic layer with an intended width and manufacture the organic EL element in simple steps.

Solution to Problem

The present invention is a method for producing an organic EL element having a pair of electrodes and at least one organic layer arranged between the electrodes, in which at least one light-emitting layer is provided as the at least one organic layer. This method comprises the steps of forming one of the pair of electrodes, forming one or a plurality of organic layers, and forming the other of the pair of electrodes. In the step of forming one or a plurality of organic layers, an object to be coated to become an organic EL element is arranged such that a surface to form the organic layer faces down, while a nozzle having a plurality of slit-shaped outlets for discharging thereabove a coating liquid containing a material to become the organic layer and downwardly depressed cutouts respectively formed at both end parts of each of the slit-shaped outlets is arranged under the object. Then, a coating step of moving the nozzle and the object relative to each other in a predetermined coating direction while keeping the coating liquid discharged from the nozzle in contact with the object and a non-coating step of moving the nozzle and the object relative to each other in the coating direction while keeping the coating liquid away from the object are alternately repeated, so as to apply the coating liquid to the surface and form a film, and solidify the applied and formed film, thereby forming the organic layer.

In the present invention, the nozzle may comprise a pair of nozzle bodies arranged so as to oppose each other with a lateral width of the slit-shaped outlets therebetween and a shim having a thickness as the lateral width of the slit-shaped outlets and being held by the nozzle bodies so as to be disposed in a region excluding the slit-shaped outlets and define a longitudinal width of the slit-shaped outlets, an outer edge of the pair of nozzle bodies and an outer edge of the shim being arranged substantially flush with each other in the cutouts.

In the present invention, the cutout may be formed such as to tilt away from the slit-shaped outlets from an upper end to a lower end.

The present invention also relates to an illumination device comprising an organic electroluminescence element produced by the above-mentioned method.

The present invention also relates to a planar light source comprising an organic electroluminescence element produced by the above-mentioned method.

The present invention can apply a pattern of a coating liquid to become an organic layer with an intended width and manufacture the organic EL element in simple steps.

DESCRIPTION OF EMBODIMENTS

The method for producing an organic EL element in accordance with the present invention is a method for making an organic EL element having a pair of electrodes and at least one organic layer arranged between the electrodes. In the organic EL element, at least one light-emitting layer is provided as the at least one organic layer. This method for producing an organic EL element in accordance with the present invention comprises the steps of forming one of the pair of electrodes, forming one or a plurality of organic layers, and forming the other of the pair of electrodes.

Figure 7:
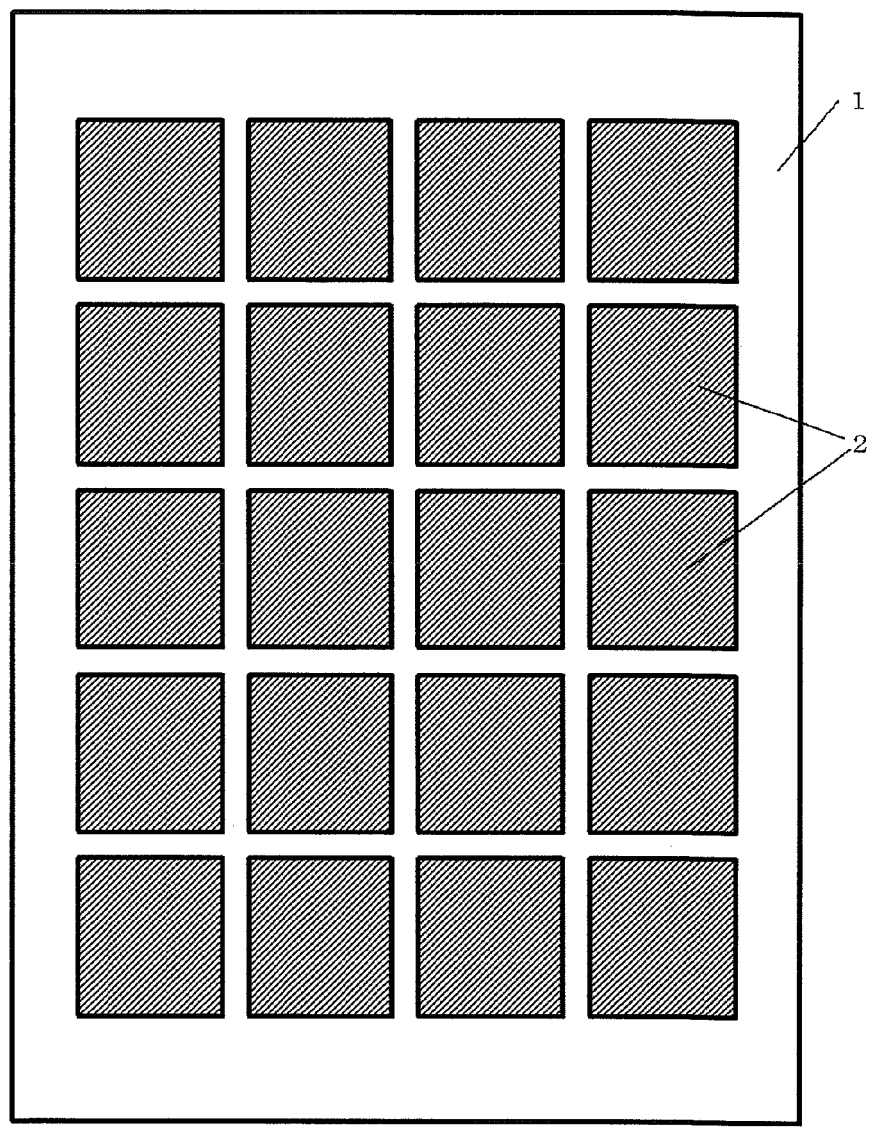
FIG. 7 is a plan view of an object to be coated to become an organic EL element.
Figure 7:
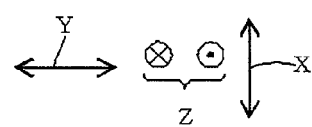

The organic EL element is typically formed on a support substrate 1, which is made of glass or a resin, by stacking electrodes and organic layers constituting the organic EL element in a predetermined order on the support substrate 1. This embodiment forms a plurality of organic EL elements into a matrix on the support substrate 1 (see FIG. 7). That is, on the support substrate 1, a plurality of organic EL elements are formed at predetermined intervals in an arrangement direction Y and at predetermined intervals in a coating direction X perpendicular to the arrangement direction Y.

While there are various modes in layer structures of the organic EL element as will be explained later, an organic EL element in which an anode corresponding to one of a pair of electrodes, a hole injection layer, a light-emitting layer, and a cathode corresponding to the other of the pair of electrodes are stacked in this order from the support substrate 1 side will be explained as their example in this embodiment.

First, in this embodiment, a plurality of anodes are formed into a matrix on the support substrate 1 by a predetermined method which will be explained later. That is, on the support substrate 1, a plurality of anodes are formed at predetermined intervals in the arrangement direction Y and at predetermined intervals in the coating direction X. Each anode, which is flat, is formed into a substantially rectangular shape when seen as a plane, for example.

Subsequently, in this embodiment, a hole injection layer is formed on each anode. The hole injection layer is formed such that its outer edge substantially coincides with outer edge of each anode when seen as a plane, for example. It is preferable that the hole injection layer is formed as a pattern only on the anode by a method using a predetermined nozzle as in a method of forming a light-emitting layer which will be explained later, when forming the hole injection layer by an application process.

Next, a light-emitting layer to be provided as one or one of a plurality of organic layers is formed on the hole injection layer. The step of forming the light-emitting layer corresponds to the step of forming one or a plurality of organic layers. Therefore, the step of forming one or a plurality of organic layers will be explained in terms of the step of forming the light-emitting layer. In this embodiment, the substrate that the anode and hole injection layer are formed on the support substrate 1 corresponds to an object to be coated to become an organic EL element, while the front face of the hole injection layer corresponds to a surface 2 to form the organic layer (a hatched region in FIG. 7). While this embodiment forms the light-emitting layer by a step of forming one or a plurality of organic layers, when there are a plurality of organic layers, it is sufficient for at least one of the plurality of organic layers, which is not limited to the light-emitting layer, to be formed as a pattern by an application process using a predetermined nozzle as in a method of forming a light-emitting layer which will be explained later. More preferably, all of the plurality of organic layers are formed as a pattern by an application process using a predetermined nozzle as in the method of forming a light-emitting layer which will be explained later.

In the step of forming the light-emitting layer, an object to be coated to become the organic EL element is arranged such that a surface to form the organic layer faces down, while a nozzle having a plurality of slit-shaped outlets for discharging thereabove a coating liquid containing a material to become the organic layer and downwardly depressed cutouts respectively formed at both end parts of each of the slit-shaped outlets is arranged under the object. Then, a coating step of moving the nozzle and the object relative to each other in a predetermined coating direction while keeping the coating liquid discharged from the nozzle in contact with the object and a non-coating step of moving the nozzle and the object relative to each other in the coating direction while keeping the coating liquid away from the object are alternately repeated, so as to apply the coating liquid to the surface and form a film, and solidify the applied and formed film, thereby forming the organic layer. In the specification, "the coating liquid in contact with the object" means a state in which the coating liquid is attached to the object.

Examples of methods for discharging the coating liquid upward from the nozzle include methods utilizing capillary force and/or static pressure and methods using pump power. As an example of them, a CAP coating method which applies a coating liquid by discharging the coating liquid upward by utilizing capillary force and static pressure will be explained in the following.

Figure 1:
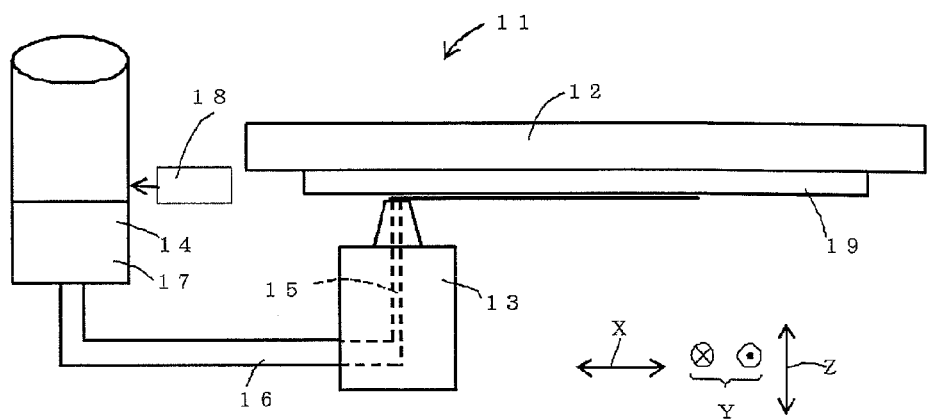
FIG. 1 is a diagram schematically illustrating a CAP coater system 11 used for forming a light-emitting layer.

FIG. 1 is a diagram schematically illustrating a CAP coater system 11 used for forming a light-emitting layer. An "upper side" is meant "the upper side in the vertical direction" and a "lower side" is meant "the lower side in the vertical direction", in the following in the specification. In the following explanation of the CAP coater system 11, structures and configurations of a nozzle 13 and the like will be based on their arrangement at the time of applying the coating liquid.

The CAP coater system 11 is configured to mainly include a surface plate 12, the nozzle 13, and a tank 14.

An object to be coated 19 is held on the lower face of the surface plate 12. The object 19 is held by the surface plate 12 such that a surface (of a hole injection layer in this embodiment) to be formed with an organic layer (a light-emitting layer in this embodiment) faces down. The surface plate 12 holds the object 19 by vacuum suction, for example. The surface plate 12 is horizontally moved to and fro by displacement driving means such as a motor or hydraulic machine which is not depicted. The moving direction of the surface plate 12 corresponds to the coating direction X, while a direction perpendicular to both of the vertical direction Z and coating direction X corresponds to the arrangement direction Y.

Figure 2:
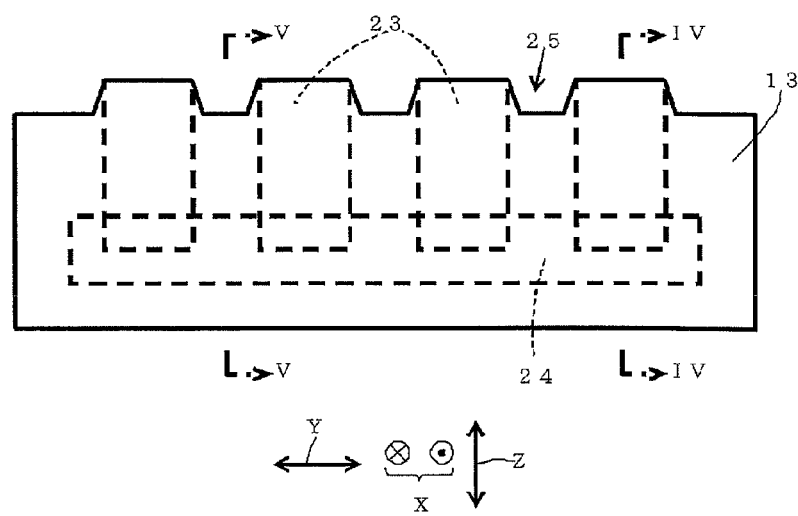
FIG. 2 is a side view of a nozzle 13.
Figure 3:
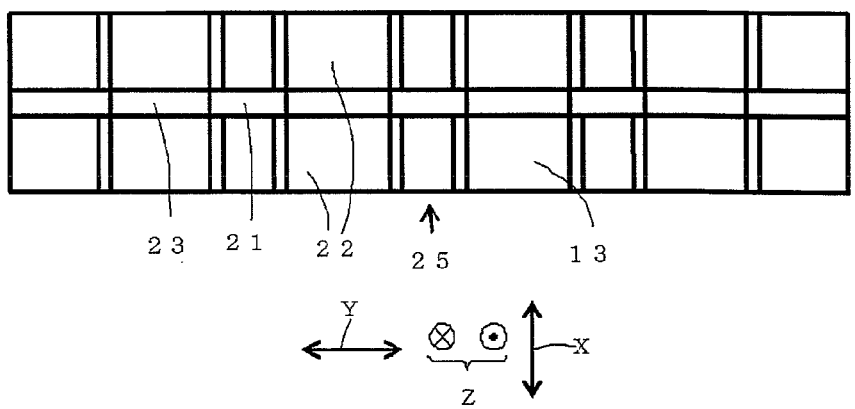
FIG. 3 is a top plan view of the nozzle 13.
Figure 4:
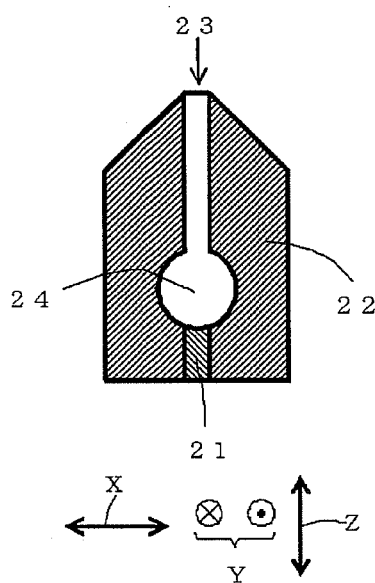
FIG. 4 is a sectional view taken along the line IV-IV of FIG. 2.
Figure 5:
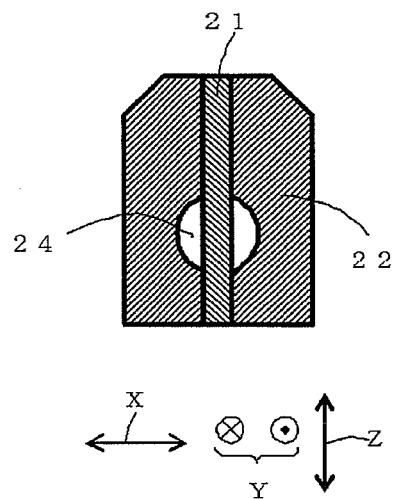
FIG. 5 is a sectional view taken along the line V-V of FIG. 2.
Figure 6:
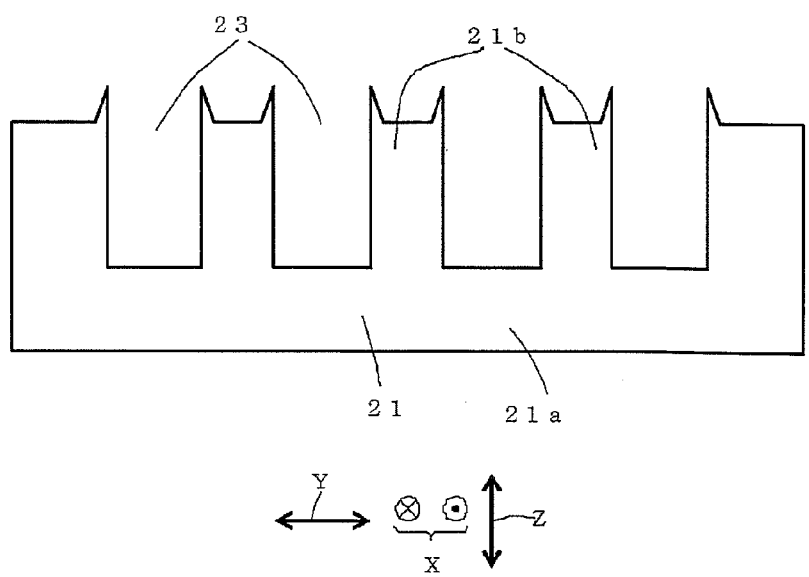
FIG. 6 is a side view of a shim 21.

The nozzle 13 comprises a plurality of slit-shaped outlets for discharging thereabove a coating liquid containing a material to become the organic layer and downwardly depressed cutouts 25 formed at both end parts of the slit-shaped outlets and is arranged under the object 19. In this embodiment, four slit-shaped outlets are arranged at predetermined intervals in the arrangement direction Y. FIG. 2 is a side view of the nozzle 13, FIG. 3 is a top plan view of the nozzle 13, FIG. 4 is a sectional view taken along the line IV-IV of FIG. 2, and FIG. 5 is a sectional view taken along the line V-V of FIG. 2. FIG. 6 is a side view of a shim 21.

The nozzle may be formed integrally but the nozzle 13 preferably comprises a pair of nozzle bodies 22 and a shim 21 held therebetween as illustrated in FIGS. 2 and 3. The pair of nozzle bodies 22 are arranged so as to oppose each other with the lateral width of the slit-shaped outlets 23 therebetween as illustrated in FIGS. 3 to 5. The shim 21 has a thickness as the lateral width of the slit-shaped outlets 23 and is held by the nozzle bodies so as to be disposed in a region excluding the slit-shaped outlets and define the longitudinal width of the slit-shaped outlets.

The gap between the pair of nozzle bodies 22 is defined by the thickness of the shim 21 held therein. That is, the shim 21 functions as a spacer. The width in the lateral direction (corresponding to the coating direction X in this embodiment) of the slit-shaped outlets 23 is determined by the gap between the pair of nozzle bodies 22 and consequently by the thickness of the shim 21 defining the gap between the pair of nozzle bodies 22. The lateral width of the slit-shaped outlets 23, which is set appropriately according to properties of the coating liquid, the thickness of the coating film, and the like, can be adjusted by changing the thickness of the shim 21. Since this embodiment utilizes a capillary action, the lateral width of the slit-shaped outlets 23 is typically on the order of 0.01 to 1 mm, preferably 50 to 500 µm, more preferably 50 to 200 µm.

The pair of nozzle bodies 22 are respectively formed with columnar voids each having a semicircular bottom face, which form a circular cylindrical void extending in the arrangement direction Y when bonded together. When the pair of nozzle bodies 22 are bonded together with the shim 21 interposed therebetween, the semicircular cylindrical voids respectively formed in the nozzle bodies 22 function as a manifold 24.

As illustrated in FIGS. 2 and 3, the plurality of slit-shaped outlets 23 are arranged at predetermined intervals in the arrangement direction Y while their longitudinal direction coincides with the arrangement direction Y (the direction perpendicular to the coating direction X and vertical direction Z). Each slit-shaped outlet 23 extends in the vertical direction Z from the upper end of the nozzle 13 to the manifold 24 and communicates with the manifold 24. Since the manifold 24 is filled with the coating liquid, each slit-shaped outlet 23 is supplied with the coating liquid from the manifold 24 by capillary force. The width in the longitudinal direction (arrangement direction Y) of the slit-shaped outlet 23 is set to the width in the arrangement direction Y of the coating film, which is 10 to 300 mm, for example.

While the lateral width of the slit-shaped outlets 23 is defined by the thickness of the shim 21 as mentioned above, the shim 21 defines the width in the longitudinal direction (arrangement direction Y) of the slit-shaped outlets 23 in addition to the width in the lateral direction (coating direction X) in this embodiment. The shim 21 in this embodiment, which is disposed in a region excluding the slit-shaped outlets, has a planar body 21a extending in the arrangement direction Y and a plurality of board-like liquid-blocking parts 21b extending upward from the planar body 21a while being separated from each other by the width of the slit-shaped outlets 23 in the arrangement direction Y (see FIG. 6). The planar body 21a is arranged under the manifold 24 so as to extend in the arrangement direction Y, while the liquid-blocking parts 21b are disposed in regions excluding the regions (liquid-communicating regions) provided with the slit-shaped outlets 23. In this embodiment, the planar body 21a is formed integrally with the liquid-blocking parts 21b. In the following, "the regions provided with the slit-shaped outlets 23" may also be referred to as liquid-communicating regions. The regions provided with the liquid-blocking parts 21b do not discharge the coating liquid, since the upward movement of the coating liquid from the manifold 24 is blocked by the liquid-blocking parts 21b. On the other hand, the regions (liquid-communicating regions) interposed among the plurality of liquid-blocking parts 21b are formed with voids (slit-shaped outlets 23) communicating with the manifold 24, whereby the coating liquid contained in the manifold 24 can be discharged upward through the slit-shaped outlets 23. As a consequence, the slit-shaped outlets 23 disposed at predetermined intervals in the arrangement direction Y can selectively discharge the coating liquid.

When the shim 21 having the liquid-blocking parts 21b is used, the shim 21, which is typically employed for defining the lateral width of the slit-shaped outlets 23, can also be utilized as a member for defining the longitudinal width of the slit-shaped outlets 23, which makes it unnecessary to provide an additional member for defining the longitudinal width of the slit-shaped outlets 23, thereby simplifying the device structure. For defining the longitudinal width of the slit-shaped outlets 23, it will be sufficient if a predetermined member is arranged such that no coating liquid discharges except from the slit-shaped outlets 23; structures other than the shim may also be employed as such a member in other embodiments. While the nozzle 13 is preferably constructed by the shim 21, the lateral width of the slit-shaped outlets 23 can easily be adjusted by replacing the shim 21 with another, whereby a nozzle integrally formed with the liquid-blocking parts without the shim 21 may also be employed.

The nozzle 13 has the downwardly depressed cutouts 25 formed at both end parts of the slit-shaped outlets 23.

In the nozzle provided with partitions explained in the prior art, the partitions are formed flush with the leading end of the slit-shaped outlets. When a coating film is formed by such a nozzle, the coating liquid coming into contact with the surface to form the coating film after discharging from the slit-shaped outlets extends longitudinally of the slit-shaped outlets through the leading end faces of the partitions, whereby the coating film tends to become wider than the longitudinal width of the slit-shaped outlets. In this embodiment, by contrast, the nozzle is provided with the cutouts, whereby the coating liquid in contact with the surface to form the coating film after discharging from the slit-shaped outlets can be prevented from extending longitudinally of the slit-shaped outlets even if it may spread in the depressing direction of the cutouts. Using such a nozzle can inhibit the coating film from expanding its width and form the coating film with an intended width.

When a shim is provided as in this embodiment, it will be preferred if the outer edge of the pair of nozzle bodies and the outer edge of the shim are arranged substantially flush with each other in the cutouts. That is, in the cutouts, the outer edge of the shim is preferably formed along the outer edge of the pair of nozzle bodies. In the embodiment illustrated in FIG. 2, for example, the nozzle is constructed such that the outer edge of the shim downwardly tilting from both ends of the slit-shaped outlets and the outer edge of the pair of nozzle bodies overlap each other in the cutouts when seen from one side in the coating direction X. If the outer edge of the pair of nozzle bodies and the outer edge of the shim are not arranged substantially flush with each other in the cutouts, so that one of the pair of nozzle bodies and the shim is depressed, the coating liquid may spread through the outer edge of the depressed one, thereby making the coating film wider than intended. Arranging the outer edge of the pair of nozzle bodies and the outer edge of the shim substantially flush with each other as in this embodiment can prevent the coating liquid from flowing through the cutouts and form the coating film with an intended width.

Preferably, the cutouts are formed such as to tilt away from the slit-shaped outlets from the upper end to the lower end. When the cutouts are provided so as to tilt as such, a coating film with an intended width can be formed more reliably than with the vertically depressed cutouts.

The nozzle 13, which is supported such as to be displaceable in the vertical direction Z, is driven by displacement driving means such as a motor or hydraulic machine so as to be displaced in the vertical direction Z.

A coating liquid 17 to be applied to the object 19 is contained in the tank 14. The coating liquid 17 is a liquid containing an organic material to become a light-emitting layer, which is specifically a solution in which a light-emitting material which will be explained later is dissolved in a solvent. The manifold 24 of the nozzle 13 and the tank 14 communicate with each other through a coating liquid supply tube 16. The coating liquid 17 contained in the tank 14 is fed to the manifold 24 through the coating liquid supply tube 16 and applied to the object 19 through the slit-shaped outlets 23. The tank 14, which is supported such as to be displaceable in the vertical direction Z, is driven by displacement driving means such as a motor or hydraulic machine so as to be displaced in the vertical direction Z. The tank 14 further comprises a liquid level sensor 18 for detecting the liquid level of the coating liquid 17. The liquid level position of the coating liquid 17 is detected by the liquid level sensor 18. The liquid level sensor 18 is put into practice by an optical sensor or an ultrasonic vibration sensor, for example.

The coating liquid 17 fed from the tank 14 to the slit-shaped outlets 23 through the coating liquid supply tube 16 is pushed out of the slit-shaped outlets 23 in response to the pressure (static pressure) occurring according to the height of the liquid level within the tank 14 and the force caused by the capillary action in the slit-shaped outlets 23. The discharged amount of the coating liquid 17 pushed out of the slit-shaped outlets 23 can be adjusted by regulating the vertical position of the tank 14 in order to control the relative difference between the liquid level position within the tank 14 and the liquid level position within the nozzle 13. Since the manifold 24 communicates with all the slit-shaped outlets 23, controlling the liquid level within the tank 14 can regulate the liquid levels of the coating liquid in all the slit-shaped outlets 23 at the same time.

The CAP coater system 11 further comprises a control unit which is put into practice by a microcomputer or the like. The control unit controls the above-mentioned displacement driving means and the like. The control unit controls the displacement driving means, so as to regulate the positions of the nozzle 13 and tank 14 in the vertical direction Z and the displacement of the surface plate 12 in the coating direction X. When applied, the coating liquid 17 is consumed, so that the liquid level of the coating liquid 17 within the tank 14 comes down with time. However, the control unit controls the displacement driving means according to the result of detection by the liquid level sensor 18, so as to adjust the position of the tank 14 in the vertical direction Z, thereby making it possible to regulate the height of the coating liquid 17 pushed out of the slit-shaped outlets 23.

Actions at the time of applying the coating liquid by the CAP coating system 11 explained in the foregoing will now be set forth. Using the nozzle 13 equipped with the four slit-shaped outlets 23 illustrated in FIG. 2 can apply the coating liquid as a pattern in rectangular regions arranged into a matrix (5 lines×4 rows) represented in FIG. 7.

The CAP coater system 11 applies the coating liquid as a pattern by repeating the following coating and non-coating steps.

Coating Step

The coating step moves the nozzle 13 and object 19 relative to each other in a predetermined coating direction while keeping the coating liquid discharged from the nozzle 13 in contact with the object 19.

First, the tank 14 is moved up such that the liquid level of the coating liquid within the tank 14 is higher than the upper end of the nozzle 13, so as to discharge the coating liquid from the slit-shaped outlets 23, and the nozzle 13 is raised so that the coating liquid discharged from the slit-shaped outlets 23 comes into contact with the object 19.

After the coating liquid is brought into contact with the object 19, while keeping the coating liquid in contact with the object 19, the nozzle 13 is lowered in order to provide a desired gap between the nozzle 13 and object 19, and the tank 14 is moved down such that the liquid level of the coating liquid within the tank 14 is lower than the upper end of the nozzle 13. The gap between the object 19 and nozzle 13 is set appropriately according to properties of the coating liquid, the thickness of the coating film, and the like. Since this embodiment utilizes the capillary action, the gap between the object 19 and nozzle 13 is set to about 0.05 to 0.3 mm, for example, preferably about 0.2 to 0.3 mm.

Subsequently, the object 19 is moved to one side (right side in FIG. 1) of the coating direction X. After being moved by a predetermined distance, the object 19 is stopped moving. This forms four band-shaped coating films. By adjusting the gap between the object 19 and nozzle 13, the moving speed of the nozzle, and the like, a coating film having a coating thickness on the order of 5 to 500 µm, for example, can be formed. Though this embodiment moves the object 19 at the time of applying the coating liquid, the nozzle 13 may be moved to the other side (left side in FIG. 1) of the coating direction X, or both of the nozzle 13 and object 19 may be moved.

Non-Coating Step

The non-coating step moves the nozzle and object relative to each other in the coating direction while keeping the coating liquid away from the object.

First, both of the nozzle 13 and tank 14 are moved down, so as to separate the coating liquid from the object. While the coating liquid is discharged from the slit-shaped outlets 23 in the state where the coating liquid is in contact with the object 19, the liquid level of the coating liquid within the tank 14 is made lower than the upper end of the nozzle 13 in the state where the coating liquid is separated from the object 19, so that the coating liquid retracts into the slit-shaped outlets 23.

Subsequently, while keeping the coating liquid away from the object 19, the object 19 is moved by a predetermined distance to one side (right side in FIG. 1) of the coating direction X. Here, since the coating liquid is separated from the object 19, no coating liquid is applied to the object 19.

Repeatedly performing the foregoing coating and non-coating steps can apply the coating liquid as a pattern in both of the coating direction X and arrangement direction Y, thereby effecting two-dimensional pattern coating with the coating liquid. This can prevent unnecessary parts from being coated with the coating liquid and save the step of removing the coating liquid applied to the unnecessary parts. Using the nozzle having the above-mentioned cutouts can apply the coating liquid with an intended coating width.

The coating liquid contains a material to become a layer to be formed (an organic material to become a light-emitting layer in this embodiment) and a solvent. As the solvent for the coating liquid, a single solvent exhibiting a predetermined boiling point may be used alone, or a plurality of kinds of solvents may be used together. Preferred as the solvent are those which can dissolve a material to become a layer to be formed (an organic material to become a light-emitting layer in this embodiment), examples of which are listed in the following. The examples include aliphatic chlorine-based solvents such as chloroform (boiling point: 61° C.), methylene chloride (boiling point: 40° C.), 1,1-dichloroethane (boiling point: 57° C.), 1,2-dichloroethane (boiling point: 83° C.), 1,1,1-trichloroethane (boiling point: 74° C.), and 1,1,2-trichloroethane (boiling point: 113° C.); aromatic chlorine-based solvents such as chlorobenzene (boiling point: 132° C.), o-dichlorobenzene (boiling point: 180° C.), m-dichlorobenzene (boiling point: 173° C.), and p-dichlorobenzene (boiling point: 174° C.); aliphatic ether-based solvents such as tetrahydrofuran (boiling point: 66° C.) and 1,4-dioxane (boiling point: 101° C.); aromatic ether-based solvents such as anisole (boiling point: 154° C.) and ethoxybenzene (boiling point: 170° C.); aromatic hydrocarbon-based solvents such as toluene (boiling point: 111° C.), o-xylene (boiling point: 144° C.), m-xylene (boiling point: 139° C.), p-xylene (boiling point: 138° C.), ethylbenzene (boiling point: 136° C.), p-diethylbenzene (boiling point: 184° C.), mesitylene (boiling point: 211° C.), n-propylbenzene (boiling point: 159° C.), isopropylbenzene (boiling point: 152° C.), n-butylbenzene (boiling point: 183° C.), isobutylbenzene (boiling point: 173° C.), s-butylbenzene (boiling point: 173° C.), tetralin (boiling point: 208° C.), and cyclohexylbenzene (boiling point: 235° C. measured at 737 mmHg); aliphatic hydrocarbon-based solvents such as cyclohexane (boiling point: 81° C.), methylcyclohexane (boiling point: 101° C.), n-pentane (boiling point: 36° C.), n-hexane (boiling point: 69° C.), n-heptane (boiling point: 98° C.), n-octane (boiling point: 126° C.), n-nonane (boiling point: 151° C.), n-decane (boiling point: 174° C.), decalin (boiling point: 196° C. (cis) or 187° C. (trans)), and bicyclohexyl (boiling point: 217 to 233° C.); aliphatic ketone-based solvents such as acetone (boiling point: 56° C.), methyl ethyl ketone (boiling point: 80° C.), methyl isobutyl ketone (boiling point: 117° C.), cyclohexanone (boiling point: 156° C.), 2-heptanone (boiling point: 150° C.), 3-heptanone (boiling point: 147° C. measured at 765 mmHg), 4-heptanone (boiling point: 144° C.), 2-octanone (boiling point: 174° C.), 2-nonanone (boiling point: 195° C.), and 2-decanone (boiling point: 209° C.); aromatic ketone-based solvents such as acetophenone (boiling point: 202° C.); aliphatic ester-based solvents such as ethyl acetate (boiling point: 77° C.) and butyl acetate (boiling point: 120 to 125° C.); aromatic ester-based solvents such as methyl benzoate (boiling point: 200° C.), butyl benzoate (boiling point: 213° C.), and phenyl acetate (boiling point: 196° C.); solvents constituted by aliphatic polyhydric alcohol-based solvents and derivatives of aliphatic polyhydric alcohols such as ethylene glycol (boiling point: 198° C.), ethylene glycol monobutyl ether (boiling point: 171° C.), ethylene glycol monoethyl ether (boiling point: 135° C.), ethylene glycol monomethyl ether (boiling point: 125° C.), 1,2-dimethoxyethane (boiling point: 85° C.), propylene glycol (boiling point: 188° C.), 1,2-diethoxyethane (boiling point: 124° C.), triethylene glycol diethyl ether (boiling point: 222° C.), and 2,5-hexanediol (boiling point: 218° C.); aliphatic alcohol-based solvents such as methanol (boiling point: 65° C.), ethanol (boiling point: 78° C.), propanol (boiling point: 97° C.), isopropanol (boiling point: 82° C.), and cyclohexanol (boiling point: 161° C.); aliphatic sulfoxide-based solvents such as dimethyl sulfoxide (boiling point: 37° C.); and aliphatic amide-based solvents such as N-methyl-2-pyrrolidone (boiling point: 202° C.) and N,N-dimethylformamide (boiling point: 153° C.).

Preferred among them are toluene, xylene, ethylbenzene, isopropylbenzene, anisole, mesitylene, n-butylbenzene, isobutylbenzene, cyclohexylbenzene, and tetralin. Preferably, the coating liquid contains at least 50 wt % of the solvent having a boiling point lower than 170° C. with respect to the coating liquid.

In the coating liquid, the concentration of the material to become a layer is appropriately set according to the viscosity, solubility, and the like of the coating liquid and typically 10 wt % or less, preferably 0.001 wt % to 5 wt % or less, more preferably 0.01 wt % to 2 wt % or less.

Solidifying thus applied and formed coating film can form a light-emitting layer as a pattern. The coating film can be solidified by removing the solvent. The solvent can be removed by heat drying or vacuum drying, for example. When forming a coating film by a coating liquid containing a material which is polymerizable upon application of energy such as light or heat thereto, the coating film can be solidified by exposure to light, heat, or the like after being applied and formed.

Next, a cathode is formed on the light-emitting layer, whereby an organic EL element can be produced.

While an organic EL element having a structure in which an anode, a hole injection layer, a light-emitting layer, and a cathode are stacked in this order from the support substrate 1 side has been explained in the foregoing, the organic EL element is not limited to this structure. The following will explain examples of layer structures of the organic EL element, structures of individual layers, and methods for forming the individual layers.

The organic EL element comprises a pair of electrodes (an anode and a cathode) and one or a plurality of organic layers arranged between the electrodes, while at least one light-emitting layer is provided as the at least one organic layer. Inorganic layers as well as organic layers which are not limited to and may differ from light-emitting layers may be provided between the anode and cathode. Among layers provided between the anode and cathode which will be explained in the following, those containing organic substances correspond to organic layers. Preferably, among a plurality of kinds of organic layers, those which can be formed by using an application process are formed as a pattern by employing the application process using the predetermined nozzle mentioned above as a method for forming the light-emitting layer. While the organic substances constituting the organic layers may be either low- or high-molecular compounds or mixtures of low- and high-molecular compounds, high-molecular compounds are preferred because of their generally favorable solubility to the solvent, among which those having a polystyrene-equivalent number average molecular weight of $10^3$ to $10^8$ are preferred in particular.

Examples of the layers provided between the cathode and light-emitting layer include electron injection, electronic transport, and hole block layers. When both electron injection and transport layers are provided between the cathode and light-emitting layer, the layers closer to the cathode and light-emitting layer are referred to as the electron injection and transport layers, respectively.

Examples of the layers provided between the anode and light-emitting layer include hole injection, hole transport, and electron block layers. When both hole injection and transport layers are provided, the layers closer to the anode and light-emitting layer are referred to as the hole injection and transport layers, respectively.

Examples of element structures of the organic EL element include:
a) anode/light-emitting layer/cathode
b) anode/hole injection layer/light-emitting layer/cathode
c) anode/hole injection layer/light-emitting layer/electron injection layer/cathode
d) anode/hole injection layer/light-emitting layer/electron transport layer/cathode
e) anode/hole injection layer/light-emitting layer/electron transport layer/electron injection layer/cathode
f) anode/hole transport layer/light-emitting layer/cathode
g) anode/hole transport layer/light-emitting layer/electron injection layer/cathode
h) anode/hole transport layer/light-emitting layer/electron transport layer/cathode
i) anode/hole transport layer/light-emitting layer/electron transport layer/electron injection layer/cathode
j) anode/hole injection layer/hole transport layer/light-emitting layer/cathode
k) anode/hole injection layer/hole transport layer/light-emitting layer/electron injection layer/cathode
l) anode/hole injection layer/hole transport layer/light-emitting layer/electron transport layer/cathode
m) anode/hole injection layer/hole transport layer/light-emitting layer/electron transport layer/electron injection layer/cathode
n) anode/light-emitting layer/electron injection layer/cathode
o) anode/light-emitting layer/electron transport layer/cathode
p) anode/light-emitting layer/electron transport layer/electron injection layer/cathode The organic EL element may have two or more light-emitting layers or constitute a so-called multiphoton element having two or more light-emitting layers and a charge generation layer, interposed between the light-emitting layers, for generating electric charges.

The organic EL element may further be covered with a sealing member such as a sealing film or sealing plate for sealing. When mounting the organic EL element to a substrate, the anode in the pair of electrodes is typically arranged closer to the substrate, but the cathode may be done so.

For further improving the adhesion to an electrode and the charge injection therefrom, the organic EL element in this embodiment may be provided with an insulating layer having a thickness of 2 nm or less adjacent to the electrode. For improving the adhesion at interfaces, preventing mixtures, and so forth, a thin buffer film may be inserted between the layers mentioned above.

The order and number of layers to be stacked and their individual thicknesses can be set appropriately in view of light emission efficiency and element life.

Materials of layers constituting the organic EL element and methods for forming the layers will now be explained more specifically.

Substrate

Examples of materials for the substrate include glass, plastics, silicon substrates, and their laminates. As a substrate for forming the organic EL element thereon, one formed with an electric circuit beforehand may also be used.

Anode

In the organic EL element having such a structure that light is taken out from a light-emitting layer through an anode, a transparent or semitransparent electrode is used for the anode. Employable for the transparent or semitransparent electrode are thin films of metal oxides, metal sulfides, metals, and the like having high electric conductivity, among which those exhibiting high light transmittance are preferably used. Specifically, thin films made of indium oxide, zinc oxide, tin oxide, ITO, indium zinc oxide (abridged as IZO), gold, platinum, silver, copper, and the like are used, among which thin films made of ITO, IZO, or tin oxide are preferably used. Examples of methods for making the anode include vacuum vapor deposition, sputtering, ion plating, and plating. Transparent electrically conductive films made of organic substances such as polyaniline and its derivatives and polythiophene and its derivatives may also be used as the anode.

Materials which reflect light may also be used for the anode; their preferred examples include metals, metal oxides, and metal sulfides having a work function of 3.0 eV or higher.

The thickness of the anode, which can appropriately be selected in view of light transmittance and electric conductivity, is 10 nm to 10 μm, for example, preferably 20 nm to 1 μm, more preferably 50 to 500 nm.

Hole Injection Layer

Examples of hole injection materials constituting the hole injection layer include oxides such as vanadium oxide, molybdenum oxide, ruthenium oxide, and aluminum oxide; those based on phenylamine; those based on starburst amines; those based on phthalocyanine; amorphous carbon; polyaniline; and polythiophene derivatives.

An example of methods for forming the hole injection layer is forming a film from a solution containing a hole injection material. Solvents used for forming the film from the solution are not limited in particular as long as they can dissolve the hole injection material; for example, those exemplified as the solvent employed for forming the light-emitting layer and water can be used.

Examples of methods for forming the film from the solution include application processes such as spin coating, casting, microgravure coating, gravure coating, bar coating, roll coating, wire bar coating, dip coating, spray coating, screen printing, flexo printing, offset printing, and inkjet printing, while the hole injection layer is preferably formed by an application process using the predetermined nozzle mentioned above as the method for forming the light-emitting layer.

The thickness of the hole injection layer, which is appropriately set in view of electric characteristics, easiness to form the layer, and the like, is 1 nm to 1 μm, for example, preferably 2 to 500 nm, more preferably 5 to 200 nm.

Hole Transport Layer

Examples of hole transport materials constituting the hole transport layer include polyvinylcarbazole and its derivatives, polysilane and its derivatives, polysiloxane derivatives having aromatic amines in their side or main chains, pyrazoline derivatives, arylamine derivatives, stilbene derivatives, triphenyldiamine derivatives, polyaniline and its derivatives, polythiophene and its derivatives, polyarylamine and its derivatives, polypyrrole and its derivatives, poly(p-phenylenevinylene) and its derivatives, and poly(2,5-thienylenevinylene) and its derivatives.

Preferred among them as hole transport materials are high-molecular hole transport materials such as polyvinylcarbazole and its derivatives, polysilane and its derivatives, polysiloxane derivatives having aromatic amines in their side or main chains, polyaniline and its derivatives, polythiophene and its derivatives, polyarylamine and its derivatives, poly(p-phenylenevinylene) and its derivatives, and poly(2,5-thienylenevinylene) and its derivative, more preferred being polyvinylcarbazole and its derivatives, polysilane and its derivatives, and polysiloxane derivatives having aromatic amines in their side or main chains. Low-molecular hole transport materials, if any, are preferably used as being dispersed in a high-molecular binder.

Though not restricted in particular, examples of methods for forming the hole transport film include forming a film from a mixed liquid containing a high-molecular binder and a hole transport material for low-molecular hole transport materials and forming a film from a solution containing a hole transport material for high-molecular transport materials.

Solvents used for forming the film from the solution are not limited in particular as long as they can dissolve the hole transport material; for example, those exemplified as the solvent used for forming the light-emitting layer can be used.

Examples of methods for forming the film from the solution include application processes similar to the film forming methods for the hole injection layer mentioned above, while the hole transport layer is preferably formed by an application process using the predetermined nozzle mentioned above as the method for forming the light-emitting layer.

Preferred as the high-molecular binder for mixing are those which do not extremely inhibit charge transport, while those exhibiting low absorption for visible light are used favorably, examples of which include polycarbonate, polyacrylate, poly(methyl acrylate), poly(methyl methacrylate), polystyrene, polyvinyl chloride, and polysiloxane.

The thickness of the hole transport layer, which is appropriately set in view of electric characteristics, easiness to form the layer, and the like, is 1 nm to 1 μm, for example, preferably 2 to 500 nm, more preferably 5 to 200 nm.

Light-Emitting Layer

The light-emitting layer is typically formed by an organic substance which mainly emits fluorescence and/or phosphorescence, or the organic substance and a dopant for assisting it. The dopant is added in order to improve light emission efficiency and change the emission wavelength, for example. The organic substance may be either a low- or high-molecular compound, while the light-emitting layer preferably contains a high-molecular compound having a polystyrene-equivalent number average molecular weight of $10^3$ to $10^8$. Examples of light-emitting materials constituting the light-emitting layer include the following colorant-based materials, metal-complex-based materials, high-molecular materials, and dopant materials.

Colorant-Based Materials

Examples of the colorant-based materials include cyclopentamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimmers, quinacridone derivatives, and coumarin derivatives.

Metal-Complex-Based Materials

Examples of the metal-complex-based materials include metal complexes having a rare-earth metal such as Tb, Eu, or Dy or Al, Zn, Be, Ir, Pt, or the like as a center metal and oxadiazole, thiadiazole, phenylpyridine, phenylbenzimidazole, a quinoline structure, or the like as a ligand and can specifically be represented by metal complexes exhibiting emissions from the triplet excited state such as iridium complexes and platinum complexes, aluminum-quinolinol complexes, benzoquinolinol-berylium complexes, benzoxazolyl-zinc complexes, benzothiazole-zinc complexes, azomethyl-zinc complexes, porphyrin-zinc complexes, and phenanthroline-europium complexes.

High-Molecular Materials

Examples of the high-molecular materials include poly(p-phenylenevinylene) derivatives, polythiophene derivatives, poly(p-phenylene) derivatives, polysilane derivatives, polyacetylene derivatives, polyfluorene derivatives, polyvinylcarbazole derivatives, and those produced by polymerizing the above-mentioned colorant-based materials and metal-complex-based materials.

Among the above-mentioned light-emitting materials, examples of blue-emitting materials include distyrylarylene derivatives, oxadiazole derivatives, their polymers, polyvinylcarbazole derivatives, poly(p-phenylene) derivatives, and polyfluorene derivatives. Preferred among them are polyvinylcarbazole derivatives, poly(p-phenylene) derivatives, polyfluorene derivatives, and the like, which are high-molecular materials.

Examples of green-emitting materials include quinacridone derivatives, coumarin derivatives, their polymers, poly(p-phenylenevinylene) derivatives, and polyfluorene derivatives. Preferred among them are poly(p-phenylenevinylene) derivatives, polyfluorene derivatives, and the like, which are high-molecular materials.

Examples of red-emitting materials include coumarin derivatives, thiophene ring compounds, their polymers, poly(p-phenylenevinylene) derivatives, polythiophene derivatives, and polyfluorene derivatives. Preferred among them are poly(p-phenylenevinylene) derivatives, polythiophene derivatives, polyfluorene derivatives, and the like, which are high-molecular materials.

Dopant Materials

Examples of the dopant materials include perylene derivatives, coumarin derivatives, rubrene derivatives, quinacridone derivatives, squalium derivatives, porphyrin derivatives, styryl-based colorants, tetracene derivatives, pyrazolone derivatives, decacyclene, and phenoxazone. The thickness of such a light-emitting layer is typically about 2 to 200 nm.

As the method for forming the light-emitting layer, not only the above-mentioned methods, but also predetermined processes of coating, vacuum vapor deposition, transfer, and the like can be used.

While the application process using the predetermined nozzle mentioned above is preferred as a method of applying a solution containing a light-emitting material, example of other methods include coating processes such as spin coating, casting, microgravure coating, gravure coating, bar coating, roll coating, wire bar coating, dip coating, slit coating, spray coating, and nozzle coating and application processes such as gravure printing, screen printing, flexo printing, offset printing, reverse printing, and inkjet printing.

Electron Transport Layer

As electron transport materials constituting the electron transport layer, those publicly known can be used, examples of which include oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline or its derivatives, polyquinoline and its derivatives, polyquinoxaline and its derivatives, and polyfluorene and its derivatives.

Preferred among them as the electron transport materials are oxadiazole derivatives, benzoquinone and its derivatives, anthraquinone and its derivatives, metal complexes of 8-hydroxyquinoline and its derivatives, polyquinoline and its derivatives, polyquinoxaline and its derivatives, and polyfluorene and its derivatives, more preferred being 2-(4-biphenylyl)-5-(4-t-butylphenyl)-1,3,4-oxadiazole, benzoquinone, anthraquinone, tris(8-quinolinol)aluminum, and polyquinoline.

Examples of the method for forming the electron transport layer, which is not limited in particular, include vacuum vapor deposition from a powder and forming the layer from a solution or a molten state for low-molecular electron transport materials, and forming the layer from a solution or a molten state for high-molecular electron transport materials. A high-molecular binder may also be used when forming the layer from a solution or a molten state. Examples of the method for forming the layer from a solution include application processes similar to the above-mentioned methods for forming the hole injection layer, while the electron transport layer is preferably formed by an application process using the predetermined nozzle mentioned above as the method for forming the light-emitting layer.

The thickness of the electron transport layer, which is appropriately set in view of electric characteristics, easiness to form the layer, and the like, is 1 nm to 1 μm, for example, preferably 2 to 500 nm, more preferably 5 to 200 nm.

Electron Injection Layer

As materials constituting the electron injection layer, optimal materials are appropriately selected according to the kind of the light-emitting layer, examples of which include alkali metals, alkaline earth metals, alloys containing at least one kind of alkali and alkaline earth metals, oxides, halides, and carbonates of alkali or alkaline earth metals, and mixtures of these substances. Examples of the alkali metals and their oxides, halides, and carbonates include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of alkaline earth metals and their oxides, halides, and carbonates include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be constituted by a laminate of two or more layers, an example of which is LiF/Ca. The electron injection layer is formed by vapor deposition, sputtering, printing, or the like. The thickness of the electron injection layer is preferably on the order of 1 nm to 1 μm.

Cathode

Preferred as materials for the cathode are those having low work function, so as to make it easier to inject electrons into the light-emitting layer, while exhibiting high electric conductivity. In the organic EL element for taking out light from the anode side, materials exhibiting high visible light reflectance are preferred as materials for the cathode in order for the cathode to reflect the light from the light-emitting layer to the anode side. For example, alkali metals, alkaline earth metals, transition metals, and metals in group 13 of the periodic table can be used for the cathode. Examples of materials usable for the cathode include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more kinds of the metals; alloys formed by at least one kind of the metals and at least one kind of gold, silver, platinum, copper, manganese, titanium, cobalt, nickel, tungsten, and tin; and graphite or graphite intercalation compounds. Examples of the alloys include magnesium-silver alloys, magnesium-indium alloys, magnesium-aluminum alloys, indium-silver alloys, lithium-aluminum alloys, lithium-magnesium alloys, lithium-indium alloys, and calcium-aluminum alloys. Transparent electrically conductive electrodes made of electrically conductive metal oxides, electrically conductive organic substances, and the like can also be used as the cathode. Specific examples of the electrically conductive metal oxides include indium oxide, zinc oxide, tin oxide, ITO, and IZO, while examples of the electrically conductive organic substances include polyaniline and its derivatives and polythiophene and its derivatives. The cathode may be constituted by a laminate of two or more layers. The electron injection layer may be used as the cathode.

The thickness of the cathode, which is appropriately set in view of electric conductivity and durability, is 10 nm to 10 μm, for example, preferably 20 nm to 1 μm, more preferably 50 to 500 nm.

Examples of methods for making the cathode include vacuum vapor deposition, sputtering, and lamination for thermocompression-bonding thin metal films.

Insulating Layer

Examples of materials for the insulating layer include metal fluorides, metal oxides, and organic insulating materials. Examples of organic EL elements provided with insulating layers having a thickness of 2 nm or less include those provided with an insulating layer having a thickness of 2 nm or less adjacent to the cathode and those provided with an insulating layer having a thickness of 2 nm or less adjacent to the anode.

Though an application process using a predetermined nozzle while utilizing capillary force and static pressure has been explained in the foregoing in terms of the CAP coater system 11, the present invention is also applicable to processes employing capillary force, static pressure, and pumps. When applying the coating liquid by the static pressure alone without utilizing the capillary force, for example, the lateral width of the slit-shaped outlets may be increased. The discharged amount of the coating liquid can be controlled by utilizing pump power. The coating liquid may be applied by a process utilizing the capillary force together with the pump power. Though the above-mentioned non-coating step separates the coating liquid from the object by moving down the nozzle, the coating liquid may be retracted into the slit-shaped outlets by using the pump power or lowering the tank without moving down the nozzle, so as to separate the coating liquid from the object. The nozzle and object may be moved relative to each other in the coating direction while thus keeping the coating liquid away from the object. This also keeps the coating liquid from being applied to the object, since the coating liquid is separated from the object.

The organic EL element explained in the foregoing can favorably be employed for curved or planar illumination devices and planar light sources used as light sources for scanners and backlights for display devices.

Example 1

First, a washed blank glass sheet was prepared as a substrate. Using a capillary coating system (product name "CAP Coater III" manufactured by HIRANO TECSEED Co., Ltd.) as a coating machine, a coating liquid was applied onto the substrate. A mixed solution of anisole and cyclohexylbenzene (at a weight ratio of 1:1) was used as a solvent for the coating liquid. A high-molecular light-emitting material was dissolved into the mixed solvent so as to yield a concentration of 1 wt %, thereby preparing a coating liquid. Used for coating was a nozzle in which two slit-shaped outlets each adapted to discharge the coating liquid upward were arranged in the arrangement direction Y. Downwardly depressed cutouts were formed at both ends of each slit-shaped outlet. A shim was arranged integrally with a liquid-blocking part in a region excluding a region for letting the slit-shaped outlets communicate with a manifold, while the outer edges of the nozzle bodies and the outer edge of the shim were substantially flush with each other in the cutouts. Each slit-shaped outlet had a width in the coating direction X (lateral direction) of 300 μm and a width in the arrangement direction Y (longitudinal direction) of 70 mm. The two slit-shaped outlets were disposed with a gap of 20 mm therebetween in the arrangement direction Y.

The coating and non-coating steps were repeated two times, so as to apply the coating liquid. The coating step applied the coating liquid at a coating speed of 0.5 m/min, while separating an upper end part of the nozzle and the substrate from each other by a distance of 250 μm. Thus applying the coating liquid could perform pattern coating as illustrated in FIG. 8.

Comparative Example

The coating liquid was applied as in the example except that the nozzle used for coating was changed. The comparative example employed a nozzle formed with no cutouts at both ends of each slit-shaped outlet. That is, a surface flush with the upper end of the slit-shaped outlet was formed at both ends of the slit-shaped outlet.

Figure 8:
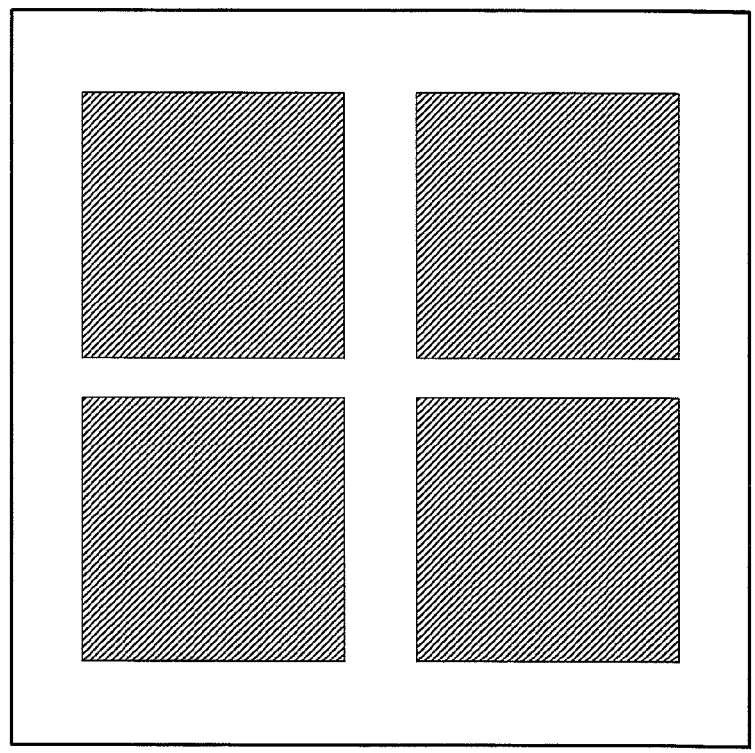
FIG. 8 is a diagram illustrating a state of a substrate coated with a coating liquid in an example.
Figure 8:
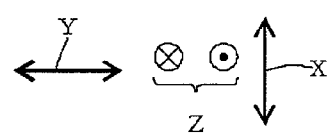
Figure 9:
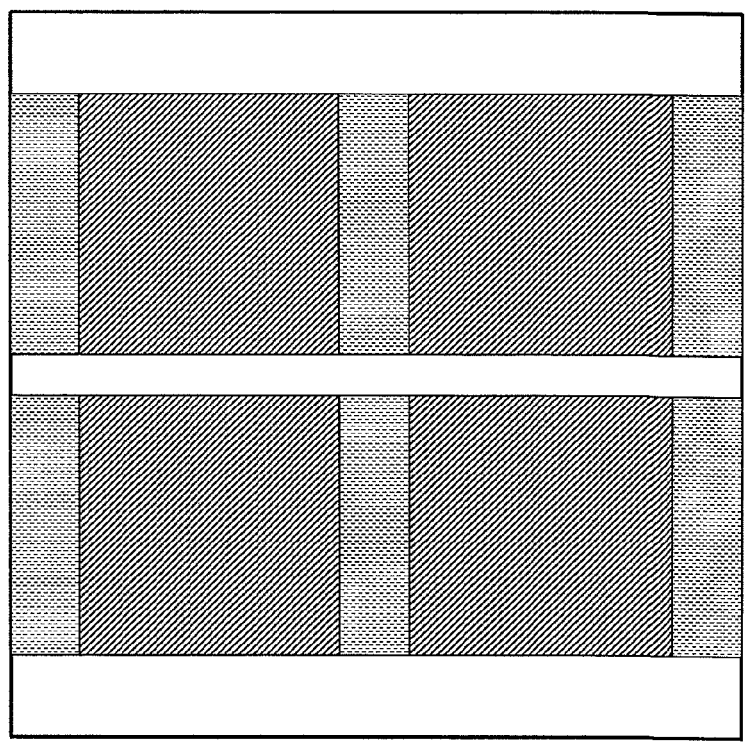
FIG. 9 is a diagram illustrating a state of a substrate coated with a coating liquid in a comparative example.
Figure 9:
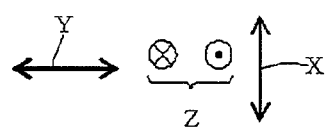

FIG. 8 is a diagram illustrating the state of the substrate coated with the coating liquid in the example, while FIG. 9 is a diagram illustrating the state of the substrate coated with the coating liquid in the comparative example. The part coated with the coating liquid is hatched in FIG. 8. In FIG. 9, the part coated with the coating liquid and intended for coating is hatched, while the part coated with the coating liquid but not intended for coating is indicated with parallel broken lines.

On the substrate coated with the coating liquid by the nozzle formed with the cutouts, the coating film could be formed in a pattern having a width corresponding to the width (70 mm) in the arrangement direction Y of the slit-shaped outlets. When the coating liquid was applied by the nozzle in which the width in the arrangement direction Y of the slit-shaped outlets was defined by the shim alone without the cutouts, the coating liquid spread in the arrangement direction Y (the longitudinal direction of the nozzle), thereby thinly covering a portion supposed to be the liquid-blocking part as well, thus failing to yield the intended pattern.

REFERENCE SIGNS LIST 1 support substrate
2 surface to form an organic layer
11 CAP coater system
12 surface plate
13 nozzle
14 tank
16 coating liquid supply tube
17 coating liquid
18 liquid level sensor
19 object to be coated
21 shim
21a planar body
21b liquid-blocking part
22 nozzle body
23 slit-shaped outlet
24 manifold
25 cutout
X coating direction
Y arrangement direction
Z vertical direction

The invention claimed is:

1. A method for producing an organic EL element having a pair of electrodes and at least one organic layer arranged between the electrodes, at least one light-emitting layer being provided as the at least one organic layer;
the method comprising the steps of forming one of the pair of electrodes, forming one or a plurality of organic layers, and forming the other of the pair of electrodes;
wherein, in the step of forming the one or a plurality of organic layers,
an object to be coated to become the organic EL element is arranged such that a surface to form the organic layer faces down,
a nozzle having a plurality of slit-shaped outlets for discharging thereabove a coating liquid containing a material to become the organic layer and downwardly depressed cutouts respectively formed at both end parts of each of the slit-shaped outlets is arranged under the object to be coated, and
a coating step of moving the nozzle and the object relative to each other in a predetermined coating direction while keeping the coating liquid discharged from the nozzle in contact with the object and a non-coating step of moving the nozzle and the object relative to each other in the coating direction while keeping the coating liquid away from the object are alternately repeated, so as to apply the coating liquid to the surface and form a film, and solidify the applied and formed film, thereby forming the organic layer,
wherein the nozzle comprises:
a pair of nozzle bodies arranged so as to oppose each other with a lateral width of the slit-shaped outlets therebetween and
a shim having a thickness as the lateral width of the slit-shaped outlets and being held by the nozzle bodies so as to be disposed in a region excluding the slit-shaped outlets and define a longitudinal width of the slit-shaped outlets; and
wherein an outer edge of the pair of nozzle bodies and an outer edge of the shim are arranged substantially flush with each other in the cutouts.

2. The method for producing an organic EL element according to claim 1, wherein the cutout is formed such as to tilt away from the slit-shaped outlets from an upper end to a lower end.

3. An illumination device comprising an organic electroluminescence element produced by the method according to claim 2.

4. A planar light source comprising an organic electroluminescence element produced by the method according to claim 2.

5. The method for producing an organic EL element according to claim 1, wherein a lateral width of the slit-shaped outlets is 0.01 mm to 1 mm and a longitudinal width of the slit-shaped outlet is 10 mm to 300 mm.

* * * * *